United States Patent
Hu et al.

(10) Patent No.: US 11,189,206 B2
(45) Date of Patent: Nov. 30, 2021

(54) SHIFT REGISTER AND DRIVING METHOD THEREOF, GATE DRIVING CIRCUIT, AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Shenghua Hu, Beijing (CN); Chunyang Nie, Beijing (CN); Xueqin Wei, Beijing (CN); Ke Dai, Beijing (CN)

(73) Assignees: Hefei Xinsheng Optoelectronics Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/963,258

(22) PCT Filed: Jan. 13, 2020

(86) PCT No.: PCT/CN2020/071710
§ 371 (c)(1),
(2) Date: Jul. 20, 2020

(87) PCT Pub. No.: WO2020/168857
PCT Pub. Date: Aug. 27, 2020

(65) Prior Publication Data
US 2021/0217342 A1    Jul. 15, 2021

(30) Foreign Application Priority Data
Feb. 21, 2019 (CN) .......................... 201910130577.7

(51) Int. Cl.
G09G 3/20    (2006.01)

(52) U.S. Cl.
CPC ....... *G09G 3/20* (2013.01); *G09G 2310/0286* (2013.01); *G09G 2310/061* (2013.01); *G09G 2310/08* (2013.01)

(58) Field of Classification Search
CPC ......... G09G 2310/08; G09G 2310/061; G09G 2310/0286
See application file for complete search history.

(56) References Cited

U.S. PATENT DOCUMENTS 8,031,141 B2 * 10/2011 Shin .................. G09G 3/325
                                                    345/76
10,573,224 B2 * 2/2020 Hao .................... G09G 3/2092
(Continued)

FOREIGN PATENT DOCUMENTS

CN    102103294 A    6/2011
CN    104123924 A    10/2014
(Continued)

OTHER PUBLICATIONS

Office Action dated Mar. 19, 2020 for Chinese Patent Application No. 201910130577.7 and English Translation.
(Continued)

*Primary Examiner* — Gene W Lee
(74) *Attorney, Agent, or Firm* — Ling Wu; Stephen Yang; Ling and Yang Intellectual Property

(57) ABSTRACT

Provided are a shift register and a driving method thereof, a gate driving circuit, and a display apparatus. The shift register is disposed on a display panel. An operating process of the display panel includes a start-up phase and a display phase. The shift register includes a shift register unit, a start-up discharge circuit, a first control end, a second control end, a signal output end and a first power supply end; the shift register unit is configured to output a gate driving signal to the signal output end in the display phase; the start-up discharge circuit is configured to provide a signal of
(Continued)

the first power supply end to the signal output end under control of the first control end and the second control end in the start-up phase.

15 Claims, 7 Drawing Sheets

(56) References Cited

U.S. PATENT DOCUMENTS

| | | | |
|---|---|---|---|
| 10,984,700 B1* | 4/2021 | Wang | G11C 19/28 |
| 2010/0283715 A1 | 11/2010 | Kretz et al. | |
| 2011/0228893 A1 | 9/2011 | Tobita et al. | |
| 2014/0253424 A1* | 9/2014 | Yu | G11C 19/28 |
| | | | 345/100 |
| 2015/0029082 A1 | 1/2015 | Jeon et al. | |
| 2015/0331269 A1 | 11/2015 | Chen et al. | |
| 2020/0082896 A1 | 3/2020 | Hu et al. | |
| 2020/0266809 A1* | 8/2020 | Shi | G11C 19/28 |
| 2021/0065630 A1* | 3/2021 | Feng | G11C 19/28 |
| 2021/0142710 A1* | 5/2021 | Lin | G09G 3/20 |

FOREIGN PATENT DOCUMENTS

| | | |
|---|---|---|
| CN | 105185293 A | 12/2015 |
| CN | 108346405 A | 7/2018 |
| CN | 109147641 A | 1/2019 |
| CN | 109326258 A | 2/2019 |
| CN | 109637430 A | 4/2019 |
| EP | 2186081 B1 | 1/2014 |
| KR | 20150011910 A | 2/2015 |

OTHER PUBLICATIONS

Office Action dated Sep. 17, 2020 for Chinese Patent Application No. 201910130577.7 and English Translation.
International Search Report for PCT/CN2020/071710 dated Apr. 17, 2020.

* cited by examiner

| A start-up discharge circuit provides a signal of a first power supply end to a signal output end under control of a first control end and a second control end in a start-up phase. | ⟶ 100 |
|---|---|
| A shift register unit outputs a gate driving signal to a signal output end in a display phase. | ⟶ 200 |

FIG. 11

SHIFT REGISTER AND DRIVING METHOD THEREOF, GATE DRIVING CIRCUIT, AND DISPLAY APPARATUS

The present application claims the priority to the Chinese patent application No. 201910130577.7 entitled "Shift Register and Driving Method Thereof, Gate Driving Circuit, and Display Apparatus", filed to the CNIPA on Feb. 21, 2019, the content of which should be regarded as being incorporated into the present application by reference.

TECHNICAL FIELD

Embodiments of the present application relate to, but are not limited to, the technical field of display, in particular to a shift register and a driving method thereof, a gate driving circuit, and a display apparatus.

BACKGROUND

With continuous development of display technology, a display panel with high resolution and a narrow frame has become a trend of development. For this reason, Gate Driver on Array (GOA) technology has emerged. The GOA technology refers to a technology that GOA circuits for driving gate lines are disposed on both sides of an effective display area of an array substrate in the display panel, wherein the GOA circuits include a plurality of shift registers, each shift register corresponds to a row of pixel units, and driving on the pixel units by scanning row by row is realized by a plurality of shift registers to display an image.

SUMMARY

The following is a summary of the subject matter described in detail in the present application. This summary is not intended to limit the protection scope of the claims.

In a first aspect, the present application provides a shift register, which is disposed on a display panel, wherein an operating process of the display panel includes a start-up phase and a display phase, and the shift register includes a shift register unit, a start-up discharge circuit, a first control end, a second control end, a signal output end and a first power supply end.

The shift register unit is connected with the signal output end, and is configured to output a gate driving signal to the signal output end in the display phase.

The start-up discharge circuit is respectively connected with the signal output end, the first control end, the second control end and the first power supply end, and is configured to provide a signal of the first power supply end to the signal output end under control of the first control end and the second control end in the start-up phase.

In some possible implementations, the start-up discharge circuit includes a first transistor and a second transistor.

A control pole of the first transistor is connected with the first control end, a first pole of the first transistor is connected with the first power supply end, and a second pole of the first transistor is connected with a first pole of the second transistor; a control pole of the second transistor is connected with the second control end, and a second pole of the second transistor is connected with the signal output end.

In some possible implementations, in the start-up phase, a signal of the first control end is a first on signal and a signal of the second control end is a second on signal.

The first on signal is configured to make the first transistor in an on state, and the second on signal is configured to make the second transistor in an on state.

In some possible implementations, in the display phase, a signal of the first control end is a first on signal and a signal of the second control end is a second off signal, or a signal of the first control end is a first off signal and a signal of the second control end is a second on signal.

The first off signal is configured to make the first transistor in an off state, and the second off signal is configured to make the second transistor in an off state.

In some possible implementations, the shift register further includes a signal input end, a reset signal end, a second power supply end, a clock signal end and a third power supply end, and the shift register unit includes a node control sub-circuit, a reset sub-circuit and an output control sub-circuit.

The node control sub-circuit is respectively connected with the signal input end, the first control end, the second control end, the pull-up node, the first pull-down node, the second pull-down node and the second power supply end, is configured to provide a signal of the signal input end to the pull-up node under control of the signal input end, and is further configured to provide a signal of the first control end or the second power supply end to the first pull-down node under control of the first control end and the pull-up node, or provide a signal of the second control end or the second power supply end to the second pull-down node under control of the second control end and the pull-up node.

The reset sub-circuit is respectively connected with the reset signal end, the pull-up node, the second power supply end, the first pull-down node, the second pull-down node and the clock signal end, and is configured to provide a signal of the second power supply end to the pull-up node under control of the reset signal end, or the first pull-down node, or the second pull-down node; and is further configured to provide a signal of the second power supply end to the clock signal end under control of the pull-up node and the first pull-down node, or under control of the pull-up node and the second pull-down node.

The output control sub-circuit is respectively connected with the pull-up node, the signal output end, the clock signal end, the first pull-down node, the second pull-down node and the third power supply end, and is configured to provide a signal of the clock signal end or the third power supply end to the signal output end under control of the pull-up node, or the first pull-down node, or the second pull-down node.

In some possible implementations, the node control sub-circuit includes a first node control sub-circuit, a second node control sub-circuit and a third node control sub-circuit.

The first node control sub-circuit is respectively connected with the signal input end and the pull-up node, and is configured to provide a signal of the signal input end to the pull-up node under control of the signal input end.

The second node control sub-circuit is respectively connected with the first control end, the pull-up node, the first pull-down node and the second power supply end, is configured to provide a signal of the first control end to the first pull-down node under control of the first control end, and is further configured to provide a signal of the second power supply end to the first pull-down node under control of the pull-up node.

The third node control sub-circuit is respectively connected with the second control end, the pull-up node, the second pull-down node and the second power supply end, is configured to provide a signal of the second control end to the second pull-down node under control of the second control end, and is further configured to provide a signal of the second power supply end to the second pull-down node under control of the pull-up node.

In some possible implementations, the reset sub-circuit includes a first reset sub-circuit, a second reset sub-circuit and a third reset sub-circuit.

The first reset sub-circuit is respectively connected with the reset signal end, the pull-up node and the second power supply end, and is configured to provide a signal of the second power supply end to the pull-up node under control of the reset signal end.

The second reset sub-circuit is respectively connected with the first pull-down node, the second pull-down node, the pull-up node and the second power supply end, and is configured to provide a signal of the second power supply end to the pull-up node under control of the first pull-down node or the second pull-down node.

The third reset sub-circuit is respectively connected with the first pull-down node, the second pull-down node, the pull-up node, the clock signal end and the second power supply end, and is configured to provide a signal of the second power supply end to the clock signal end under control of the pull-up node and the first pull-down node, or under control of the pull-up node and the second pull-down node.

In some possible implementations, the first node control sub-circuit includes a third transistor, the second node control sub-circuit includes a fourth transistor, a fifth transistor, a sixth transistor and a seventh transistor, the third node control sub-circuit includes an eighth transistor, a ninth transistor, a tenth transistor and an eleventh transistor.

A control pole and a first pole of the third transistor are connected with the signal input end, and a second pole of the third transistor is connected with the pull-up node; a control pole and a first pole of the fourth transistor are connected with the first control end, a second pole of the fourth transistor is connected with a first pole of the sixth transistor; a control pole of the fifth transistor is connected with the second pole of the fourth transistor, a first pole of the fifth transistor is connected with the first control end, and a second pole of the fifth transistor is connected with the first pull-down node; a control pole of the sixth transistor is connected with the pull-up node, and a second pole of the sixth transistor is connected with the second power supply end; a control pole of the seventh transistor is connected with the pull-up node, a first pole of the seventh transistor is connected with the first pull-down node, and a second pole of the seventh transistor is connected with the second power supply end; a control pole and a first pole of the eighth transistor are connected with the second control end, and a second pole of the eighth transistor is connected with a first pole of the tenth transistor; a control pole of the ninth transistor is connected with the second pole of the eighth transistor, a first pole of the ninth transistor is connected with the second control end, and a second pole of the ninth transistor is connected with the second pull-down node; a control pole of the tenth transistor is connected with the pull-up node, and a second pole of the tenth transistor is connected with the second power supply end; a control pole of the eleventh transistor is connected with the pull-up node, a first pole of the eleventh transistor is connected with the second pull-down node, and a second pole of the eleventh transistor is connected with the second power supply end.

In some possible implementations, the first reset sub-circuit includes a twelfth transistor, the second reset sub-circuit includes a thirteenth transistor and a fourteenth transistor, and the third reset sub-circuit includes a fifteenth transistor, a sixteenth transistor and a seventeenth transistor.

A control pole of the twelfth transistor is connected with the reset signal end, a first pole of the twelfth transistor is connected with the pull-up node, and a second pole of the twelfth transistor is connected with the second power supply end; a control pole of the thirteenth transistor is connected with the second pull-down node, a first pole of the thirteenth transistor is connected with the pull-up node, and a second pole of the thirteenth transistor is connected with the second power supply end; a control pole of the fourteenth transistor is connected with the first pull-down node, a first pole of the fourteenth transistor is connected with the pull-up node, and a second pole of the fourteenth transistor is connected with the second power supply end; a control pole of the fifteenth transistor is connected with the first pull-down node, a first pole of the fifteenth transistor is connected with a second pole of the seventeenth transistor, and a second pole of the fifteenth transistor is connected with the second power supply end; a control pole of the sixteenth transistor is connected with the second pull-down node, a first pole of the sixteenth transistor is connected with the second pole of the seventeenth transistor, and a second pole of the sixteenth transistor is connected with the second power supply end; a control pole of the seventeenth transistor is connected with the pull-up node, and a first pole of the seventeenth transistor is connected with the clock signal end.

In some possible implementations, the first reset sub-circuit further includes an eighteenth transistor.

A control pole of the eighteenth transistor is connected with the reset signal end, a first pole of the eighteenth transistor is connected with the pull-up node, and a second pole of the eighteenth transistor is connected with the second power supply end.

In some possible implementations, the output control sub-circuit includes a capacitor, a nineteenth transistor, a twentieth transistor and a twenty-first transistor.

A first end of the capacitor is connected with the pull-up node, and a second end of the capacitor is connected with the signal output end; a control pole of the nineteenth transistor is connected with the first pull-down node, a first pole of the nineteenth transistor is connected with the signal output end, and a second pole of the nineteenth transistor is connected with the third power supply end; a control pole of the twentieth transistor is connected with the second pull-down node, a first pole of the twentieth transistor is connected with the signal output end, a second pole of the twentieth transistor is connected with the third power supply end; a control pole of the twenty-first transistor is connected with the pull-up node, a first pole of the twenty-first transistor is connected with the clock signal end, and a second pole of the twenty-first transistor is connected with the signal output end.

In some possible implementations, the start-up discharge circuit includes a first transistor and a second transistor; the shift register unit includes a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor, a fifteenth transistor, a sixteenth transistor, a seventeenth transistor, an eighteenth transistor, a capacitor, a nineteenth transistor, a twentieth transistor and a twenty-first transistor.

A control pole of the first transistor is connected with the first control end, a first pole of the first transistor is connected with the first power supply end, and a second pole of the first transistor is connected with a first pole of the second transistor; a control pole of the second transistor is connected with the second control end, a second pole of the second transistor is connected with the signal output end; a control pole and a first pole of the third transistor are connected with the signal input end, and a second pole of the third transistor is connected with the pull-up node; a control pole and a first pole of the fourth transistor are connected with the first control end, and a second pole of the fourth transistor is connected with a first pole of the sixth transistor; a control pole of the fifth transistor is connected with the second pole of the fourth transistor, a first pole of the fifth transistor is connected with the first control end, and a second pole of the fifth transistor is connected with the first pull-down node; a control pole of the sixth transistor is connected with the pull-up node, and a second pole of the sixth transistor is connected with the second power supply end; a control pole of the seventh transistor is connected with the pull-up node, a first pole of the seventh transistor is connected with the first pull-down node, and a second pole of the seventh transistor is connected with the second power supply end; a control pole and a first pole of the eighth transistor are connected with the second control end, a second pole of the eighth transistor is connected with a first pole of the tenth transistor; a control pole of the ninth transistor is connected with the second pole of the eighth transistor, a first pole of the ninth transistor is connected with the second control end, and a second pole of the ninth transistor is connected with the second pull-down node; a control pole of the tenth transistor is connected with the pull-up node, and a second pole of the tenth transistor is connected with the second power supply end; a control pole of the eleventh transistor is connected with the pull-up node, a first pole of the eleventh transistor is connected with the second pull-down node, and a second pole of the eleventh transistor is connected with the second power supply end; a control pole of the twelfth transistor is connected with the reset signal end, a first pole of the twelfth transistor is connected with the pull-up node, and a second pole of the twelfth transistor is connected with the second power supply end; a control pole of the thirteenth transistor is connected with the second pull-down node, a first pole of the thirteenth transistor is connected with the pull-up node, and a second pole of the thirteenth transistor is connected with the second power supply end; a control pole of the fourteenth transistor is connected with the first pull-down node, a first pole of the fourteenth transistor is connected with the pull-up node, a second pole of the fourteenth transistor is connected with the second power supply end; a control pole of the fifteenth transistor is connected with the first pull-down node, a first pole of the fifteenth transistor is connected with a second pole of the seventeenth transistor, and a second pole of the fifteenth transistor is connected with the second power supply end; a control pole of the sixteenth transistor is connected with the second pull-down node, a first pole of the sixteenth transistor is connected with the second pole of the seventeenth transistor, and a second pole of the sixteenth transistor is connected with the second power supply end; a control pole of the seventeenth transistor is connected with the pull-up node, and the first pole of the seventeenth transistor is connected with the clock signal end; a control pole of the eighteenth transistor is connected with the reset signal end, a first pole of the eighteenth transistor is connected with the pull-up node, and a second pole of the eighteenth transistor is connected with the second power supply end; a first end of the capacitor is connected with the pull-up node, and a second end of the capacitor is connected with the signal output end; a control pole of the nineteenth transistor is connected with the first pull-down node, a first pole of the nineteenth transistor is connected with the signal output end, and a second pole of the nineteenth transistor is connected with the third power supply end; a control pole of the twentieth transistor is connected with the second pull-down node, a first pole of the twentieth transistor is connected with the signal output end, and a second pole of the twentieth transistor is connected with the third power supply end; a control pole of the twenty-first transistor is connected with the pull-up node, a first pole of the twenty-first transistor is connected with the clock signal end, and a second pole of the twenty-first transistor is connected with the signal output end.

In a second aspect, the present application also provides a gate driving circuit, including a plurality of cascaded shift registers described above.

In a third aspect, the present application also provides a display apparatus, including a gate driving circuit as described above.

In the fourth aspect, the present application also provides a method for driving a shift register, which is applied to the above shift register. The method includes: providing, by a start-up discharge circuit, a signal of a first power supply end to a signal output end under control of a first control end and a second control end in a start-up phase; and outputting, by a shift register unit, a gate driving signal to the signal output end in a display phase.

Other aspects will become apparent upon reading and understanding accompanying drawings and the detailed description.

BRIEF DESCRIPTION OF DRAWINGS

Accompanying drawings are used to provide an understanding of technical solutions of the present application and form a part of the specification. Together with embodiments of the present application, they are used to explain technical solutions of the present application and do not constitute a limitation on the technical solutions of the present application.

FIG. 11 is a flowchart of a method for driving a shift register according to an embodiment of the present application.

DETAILED DESCRIPTION

Hereinafter, embodiments of the present application will be described in detail with reference to the accompanying drawings. Without conflict, embodiments in the present application and features in the embodiments may be combined with each other arbitrarily.

Unless otherwise defined, technical terms or scientific terms used in the present application shall have ordinary meanings understood by those of ordinary skills in the field to which the present application belongs. The words "first", "second" and the like used in the present application do not indicate any order, quantity or importance, but are only used to distinguish different components. Similar words such as "including" or "containing" mean that elements or articles appearing before the word cover elements or articles listed after the word and their equivalents, and do not exclude other elements or articles. Similar words such as "connected" or "connected" are not limited to physical or mechanical connections, but may include electrical connections, whether direct or indirect.

Those skilled in the art may understand that transistors used in all embodiments of the present application may be thin film transistors or field-effect tubes or other devices with same characteristics. The thin film transistor used in the present application may be an oxide semiconductor transistor. In the present application, to distinguish two poles of the transistor except a gate, one of the poles is referred to as a first pole and the other pole is referred to as a second pole. The first pole may be a source or a drain, and the second pole may be a drain or a source. In addition, the gate of the transistor is referred to as a control pole.

When a display panel is turned on, a timing signal of a timing control circuit can only drive a shift register to operate for a certain period of time. However, before the shift register operates, pixel units in the display panel may have charge residue. This leads to a risk of screen flickering in the display panel when it is turned on, and may reduce operating stability and useful life of the display panel.

Figure 1:
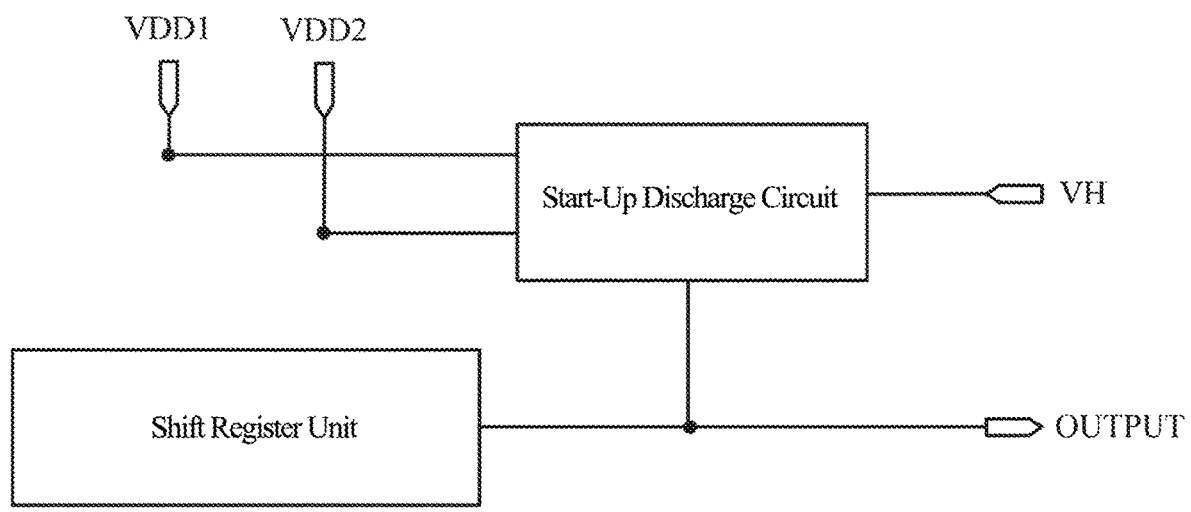
FIG. 1 is a schematic structural diagram of a shift register according to an embodiment of the present application.

FIG. 1 is a schematic structural diagram of a shift register according to an embodiment of the present application. As shown in FIG. 1, a shift register according to an embodiment of the present application is disposed on a display panel. An operating process of the display panel includes a start-up phase and a display phase. The shift register includes a shift register unit, a start-up discharge circuit, a first control end VDD1, a second control end VDD2, a signal output end OUTPUT and a first power supply end VH.

The shift register unit is connected with the signal output end OUTPUT, and is configured to output a gate driving signal to the signal output end OUTPUT in the display phase; the start-up discharge circuit is respectively connected with the signal output end OUTPUT, the first control end VDD1, the second control end VDD2 and the first power supply end VH, and is configured to provide a signal of the first power supply end VH to the signal output end OUTPUT under control of the first control end VDD1 and the second control end VDD2 in the start-up phase.

In an exemplary embodiment, the display panel further includes a plurality of rows of scanning lines, a plurality of columns of data lines, pixel units arranged in an array defined by crossing the scanning lines and the data lines, and a plurality of switching transistors, wherein the switching transistors correspond to the pixel units one by one, gates of the switching transistors are connected with the scanning lines, first poles of the switching transistors are connected with the data lines, and second poles of the switching transistors are connected with the corresponding pixel units, and are configured to provide data signals of the data lines to the pixel units when the scanning lines provide on signals. In the present embodiment, the signal of the first power supply end VH is configured to turn on the switching transistor connected with the pixel unit, and the data line is grounded in the start-up phase, so that charge within the pixel unit is released, and the start-up and charge removal may be completed.

In an exemplary embodiment, the shift register unit may also be connected with the first control end VDD1 and the second control end VDD2.

In an exemplary embodiment, if the switching transistor connected with the pixel unit is an N-type transistor, the first power supply end VH provides a continuous high electrical level. Therefore, the shift register according to the present embodiment outputs a high electrical level at the signal output end OUTPUT in the start-up phase.

The start-up phase occurs earlier than the display phase, wherein the start-up phase refers to before a signal of a signal input end INPUT is a signal that turns on the transistor connected with the signal input end INPUT, and the display phase refers to a period during which a signal output end of the shift register unit outputs a gate driving signal. In the related art, the signal output end does not output any signal in the start-up phase and outputs the gate driving signal in the display phase. However, in the embodiment of the present application, the signal output end outputs the gate driving signal not only in the display phase, but also in the start-up phase.

The shift register according to the embodiment of the present application is disposed on the display panel. An operating process of the display panel includes a start-up phase and a display phase. The shift register includes a shift register unit, a start-up discharge circuit, a first control end, a second control end, a signal output end and a first power supply end; the shift register unit is connected with the signal output end, and is configured to output a gate driving signal to the signal output end in the display phase; the start-up discharge circuit is respectively connected with the signal output end, the first control end, the second control end and the first power supply end, and is configured to provide a signal of the first power supply end to the signal output end under control of the first control end and the second control end in the start-up phase. According to the technical solution according to the embodiment of the present application, charge release of the pixel unit in the display panel may be completed before the shift register unit operates by setting a start-up discharge circuit. This avoids a risk of screen flickering in the display panel when it is turned on, and improves operating stability and useful life of the display panel.

Figure 2:
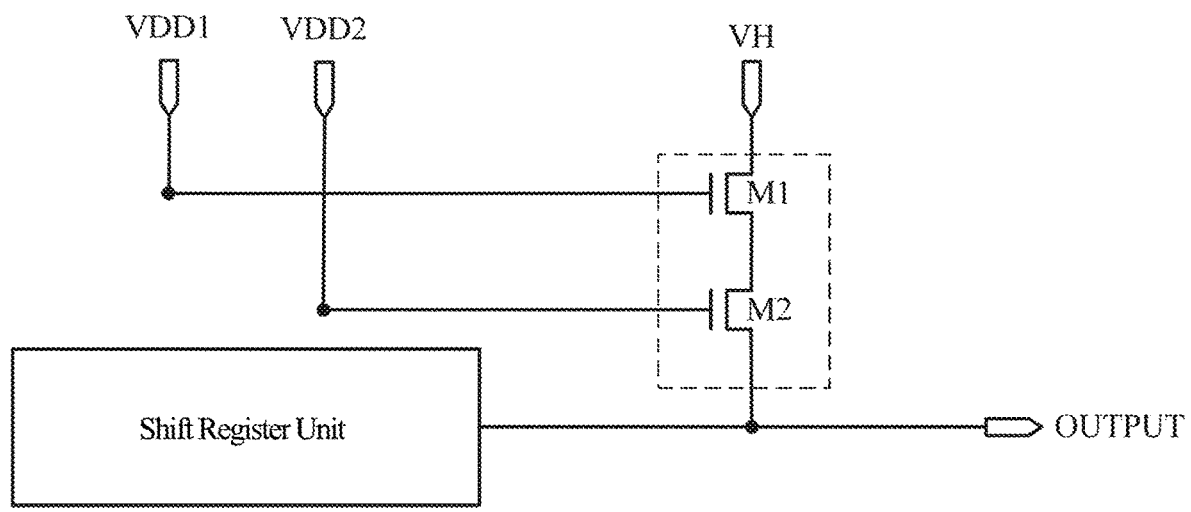
FIG. 2 is an equivalent circuit diagram of a start-up discharge circuit according to an exemplary embodiment.

FIG. 2 is an equivalent circuit diagram of a start-up discharge circuit according to an exemplary embodiment. As shown in FIG. 2, a start-up discharge circuit provided in an exemplary embodiment includes a first transistor M1 and a second transistor M2.

A control pole of the first transistor M1 is connected with the first control end VDD1, a first pole of the first transistor M1 is connected with the first power supply end VH, a second pole of the first transistor M1 is connected with a first pole of the second transistor M2; a control pole of the second transistor M2 is connected with the second control end VDD2, and a second pole of the second transistor M2 is connected with the signal output end OUTPUT.

An exemplary structure of the start-up discharge circuit is shown in FIG. 2. Those skilled in the art easily understand that the implementation of the start-up discharge circuit is not limited to this, but may also be other forms of circuit structures.

In an exemplary embodiment, in the start-up phase, a signal of the first control end VDD1 is a first on signal, and a signal of the second control end VDD2 is a second on signal. Herein, the first on signal is configured to make the first transistor M1 in an on state, and the second on signal is configured to make the second transistor M2 in an on state.

In an exemplary embodiment, in the display phase, a signal of the first control end VDD1 is a first on signal and a signal of the second control end VDD2 is a second off signal, or a signal of the first control end VDD1 is a first off signal and a signal of the second control end VDD2 is a second on signal. Herein, the first off signal is configured to make the first transistor M1 in an off state, and the second off signal is configured to make the second transistor in an off state M2.

In an exemplary embodiment, in the display phase, the first transistor M1 and the second transistor M2 are alternately turned on.

In an exemplary embodiment, the first transistor M1 and the second transistor M2 may be N-type thin film transistors, or may be P-type thin film transistors.

Figure 3:
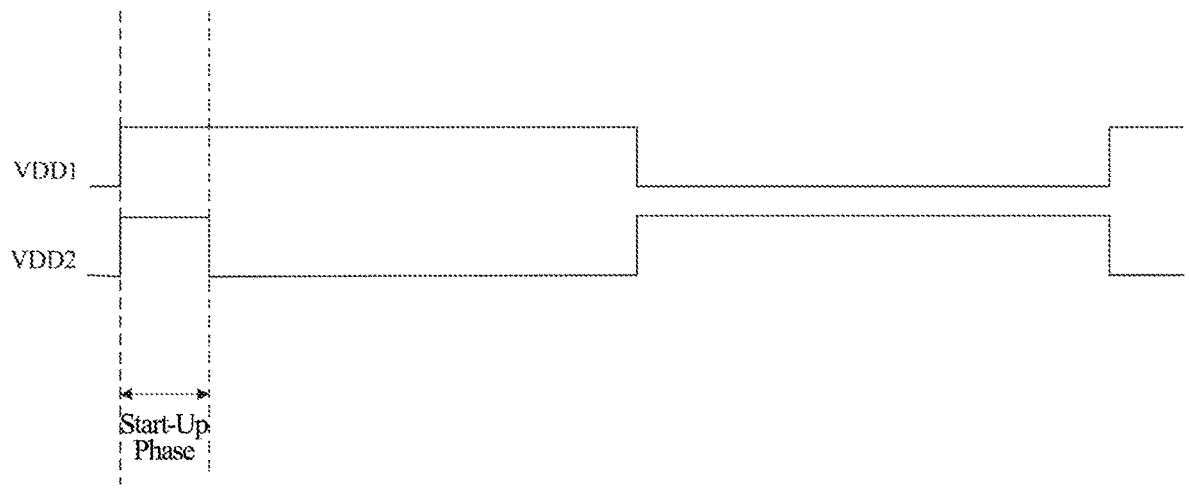
FIG. 3 is a timing chart of a signal of a first control end and a second control end according to an exemplary embodiment.

FIG. 3 is a timing chart of a signal of a first control end and a second control end according to an exemplary embodiment. As shown in FIG. 3, when the first transistor M1 and the second transistor M2 are of the same transistor type and both are N-type thin film transistors, signals of the first control end VDD1 and the second control end VDD2 are both at a high electrical level in the start-up phase, and signals of the first control end VDD1 and the second control end VDD2 are mutually inverted signals in the display phase. Timing of signals of the first control end VDD1 and the second control end VDD2 may be determined according to an actual requirement to ensure that a signal of the first power supply end may be provided to the signal output end in the start-up phase.

Figure 4:
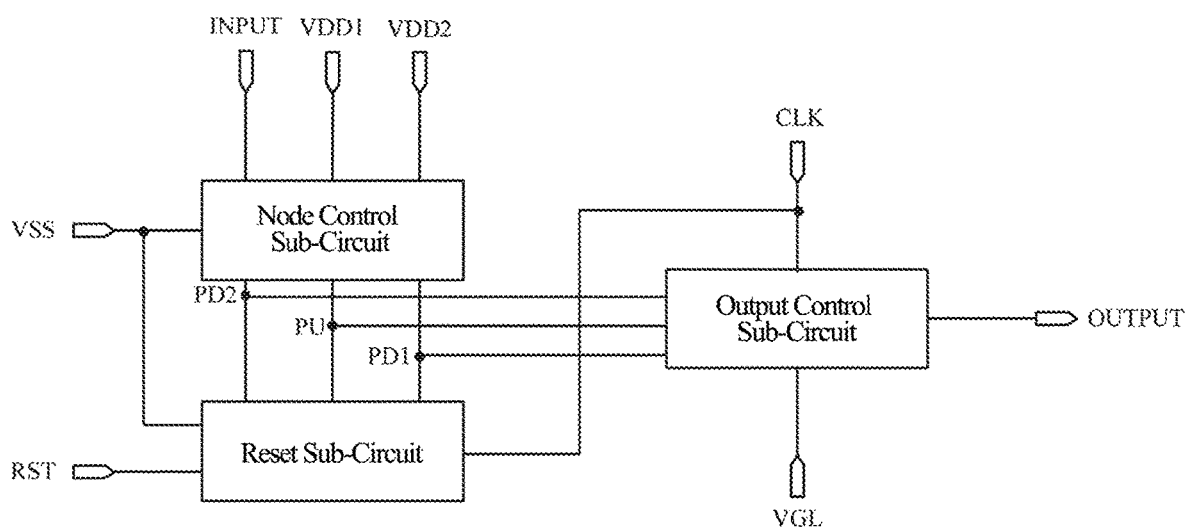
FIG. 4 is a schematic structural diagram of a shift register unit according to an exemplary embodiment.

FIG. 4 is a schematic structural diagram of a shift register unit according to an exemplary embodiment. As shown in FIG. 4, the shift register provided in an exemplary embodiment further includes a signal input end INPUT, a reset signal end RST, a second power supply end VSS, a clock signal end CLK and a third power supply end VGL. The shift register unit includes a node control sub-circuit, a reset sub-circuit and an output control sub-circuit.

The node control sub-circuit is respectively connected with the signal input end INPUT, the first control end VDD1, the second control end VDD2, a pull-up node PU, a first pull-down node PD1, a second pull-down node PD2 and the second power supply end VSS, is configured to provide a signal of the signal input end INPUT to the pull-up node PU under control of the signal input end INPUT, and is further configured to provide a signal of the first control end VDD1 or the second power supply end VSS to the first pull-down node PD1 under control of the first control end VDD1 and the pull-up node PU, or provide a signal of the second control end VDD2 or the second power supply end VSS to the second pull-down node PD2 under control of the second control end VDD2 and the pull-up node PU; the reset sub-circuit is respectively connected with the reset signal end RST, the pull-up node PU, the second power supply end VSS, the first pull-down node PD1, the second pull-down node PD2 and the clock signal end CLK, and is configured to provide a signal of the second power supply end VSS to the pull-up node PU under control of a signal of the reset signal end RST, or the first pull-down node PD1, or the second pull-down node PD2, and is further configured to provide a signal of the second power supply end VSS to the clock signal end CLK under control of the pull-up node PU and the first pull-down node PD1, or under control of the pull-up node PU and the second pull-down node PD2; the output control sub-circuit is respectively connected with the pull-up node PU, the signal output end OUTPUT, the clock signal end CLK, the first pull-down node PD1, the second pull-down node PD2 and the third power supply end VGL, and is configured to provide a signal of the clock signal end CLK or the third power supply end VGL to the signal output end OUTPUT under control of the pull-up node PU, or the first pull-down node PD1, or the second pull-down node PD2.

In an exemplary embodiment, the second power supply end VSS and the third power supply end VGL continuously provide a low electrical level, and signals of the second power supply end VSS and the third power supply end VGL may be same or different.

In an exemplary embodiment, what the signal input end INPUT inputs is a pulse signal, and an effective electrical level is input at beginning of the display phase, wherein the effective electrical level is an electrical level that turns on a transistor connected with the signal input end INPUT.

In an exemplary embodiment, the node control sub-circuit includes a first node control sub-circuit, a second node control sub-circuit and a third node control sub-circuit.

The first node control sub-circuit is respectively connected with the signal input end INPUT and the pull-up node PU, and is configured to provide a signal of the signal input end INPUT to the pull-up node PU under control of the signal input end INPUT; the second node control sub-circuit is respectively connected with the first control end VDD1, the pull-up node PU, the first pull-down node PD1 and the second power supply end VSS, is configured to provide a signal of the first control end VDD1 to the first pull-down node PD1 under control of the first control end VDD1, and is further configured to provide a signal of the second power supply end VSS to the first pull-down node PD1 under control of the pull-up node PU; the third node control sub-circuit is respectively connected with the second control end VDD2, the pull-up node PU, the second pull-down node PD2 and the second power supply end VSS, is configured to provide a signal of the second control end VDD2 to the second pull-down node PD2 under control of the second control end VDD2, and is further configured to provide a signal of the second power supply end VSS to the second pull-down node PD2 under control of the pull-up node PU.

In an exemplary embodiment, the second node control sub-circuit and the third node control sub-circuit alternately operate in the display phase to control signals of the first pull-down node and the second pull-down node, which may improve operating stability and useful life of the display panel.

Figure 5:
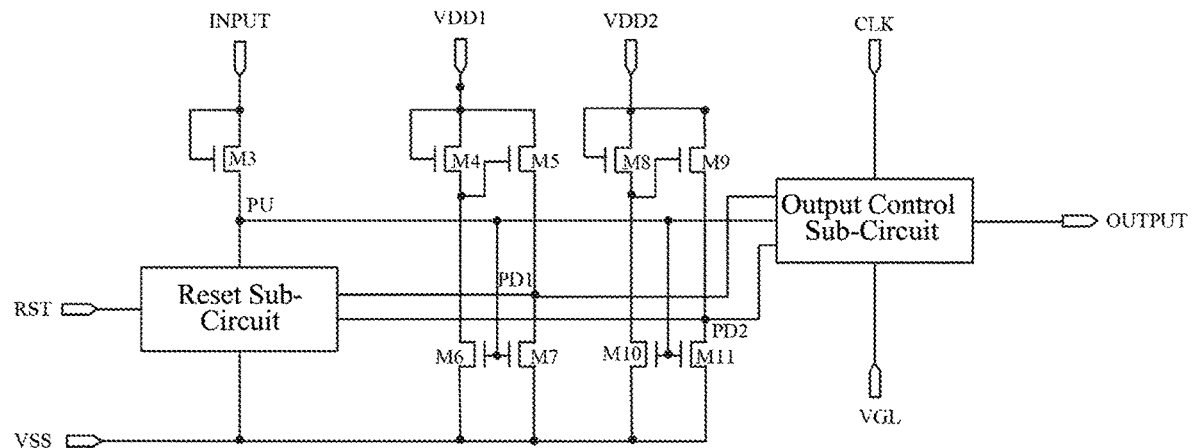
FIG. 5 is an equivalent circuit diagram of a node control sub-circuit according to an exemplary embodiment.

FIG. 5 is an equivalent circuit diagram of a node control sub-circuit according to an exemplary embodiment. As shown in FIG. 5, the first node control sub-circuit provided in an exemplary embodiment includes a third transistor M3; the second node control sub-circuit includes a fourth transistor M4, a fifth transistor M5, a sixth transistor M6, and a seventh transistor M7; and the third node control sub-circuit includes an eighth transistor M8, a ninth transistor M9, a tenth transistor M10, and an eleventh transistor M11.

A control pole and a first pole of the third transistor M3 are connected with the signal input end INPUT, and a second pole of the third transistor M3 is connected with the pull-up node PU; a control pole and a first pole of the fourth transistor M4 are connected with the first control end VDD1, and a second pole of the fourth transistor M4 is connected with a first pole of the sixth transistor M6; a control pole of the fifth transistor M5 is connected with the second pole of the fourth transistor M4, a first pole of the fifth transistor M5 is connected with the first control end VDD1, and a second pole of the fifth transistor M5 is connected with the first pull-down node PD1; a control pole of the sixth transistor M6 is connected with the pull-up node PU, and a second pole of the sixth transistor M6 is connected with the second power supply end VSS; a control pole of the seventh transistor M7 is connected with the pull-up node PU, a first pole of the seventh transistor M7 is connected with the first pull-down node PD1, and a second pole of the seventh transistor M7 is connected with the second power supply end VSS; a control pole and a first pole of the eighth transistor M8 are connected with the second control end VDD2, and a second pole of the eighth transistor M8 is connected with a first pole of the tenth transistor M10; a control pole of the ninth transistor M9 is connected with the second pole of the eighth transistor M8, a first pole of the ninth transistor M9 is connected with the second control end VDD2, and a second pole of the ninth transistor M9 is connected with the second pull-down node PD2; a control pole of the tenth transistor M10 is connected with the pull-up node PU, and a second pole of the tenth transistor M10 is connected with the second power supply end VSS; a control pole of the eleventh transistor M11 is connected with the pull-up node PU, a first pole of the eleventh transistor M11 is connected with the second pull-down node PD2, and a second pole of the eleventh transistor M11 is connected with the second power supply end VSS.

An exemplary structure of the node control sub-circuit is shown in FIG. 5. Those skilled in the art easily understand that the implementation of the node control sub-circuit is not limited to this, but may also be other forms of circuit structures.

In an exemplary embodiment, when the fourth transistor M4, the fifth transistor M5, the sixth transistor M6, the seventh transistor M7, the eighth transistor M8, the ninth transistor M9, the tenth transistor M10 and the eleventh transistor M11 are of the same transistor type, in order to ensure normal display of the display panel and improve operating stability and useful life of the display panel, in the display phase, signals of the first control end VDD1 and the second control end VDD2 are mutually inverted signals, i.e. the signals of the first control end VDD1 and the second control end VDD2 are alternately at a high electrical level and at a low electrical level. Duration of the high electrical level and duration of the low electrical level of the signal of the first control end VDD1 are determined according to an actual situation, which is not limited in any way in the present embodiment.

In an exemplary embodiment, the reset sub-circuit includes a first reset sub-circuit, a second reset sub-circuit and a third reset sub-circuit.

The first reset sub-circuit is respectively connected with the reset signal end RST, the pull-up node PU and the second power supply end VSS, and is configured to provide a signal of the second power supply end VSS to the pull-up node PU under control of the reset signal end RST; the second reset sub-circuit is respectively connected with the first pull-down node PD1, the second pull-down node PD2, the pull-up node PU and the second power supply end VSS, and is configured to provide a signal of the second power supply end VSS to the pull-up node PU under control of the first pull-down node PD1 or the second pull-down node PD2; the third reset sub-circuit is respectively connected with the first pull-down node PD1, the second pull-down node PD2, the pull-up node PU, the clock signal end CLK and the second power supply end VSS, and is configured to provide a signal of the second power supply end VSS to the clock signal end CLK under control of the pull-up node PU and the first pull-down node PD1, or under control of the pull-up node PU and the second pull-down node PD2.

Figure 6:
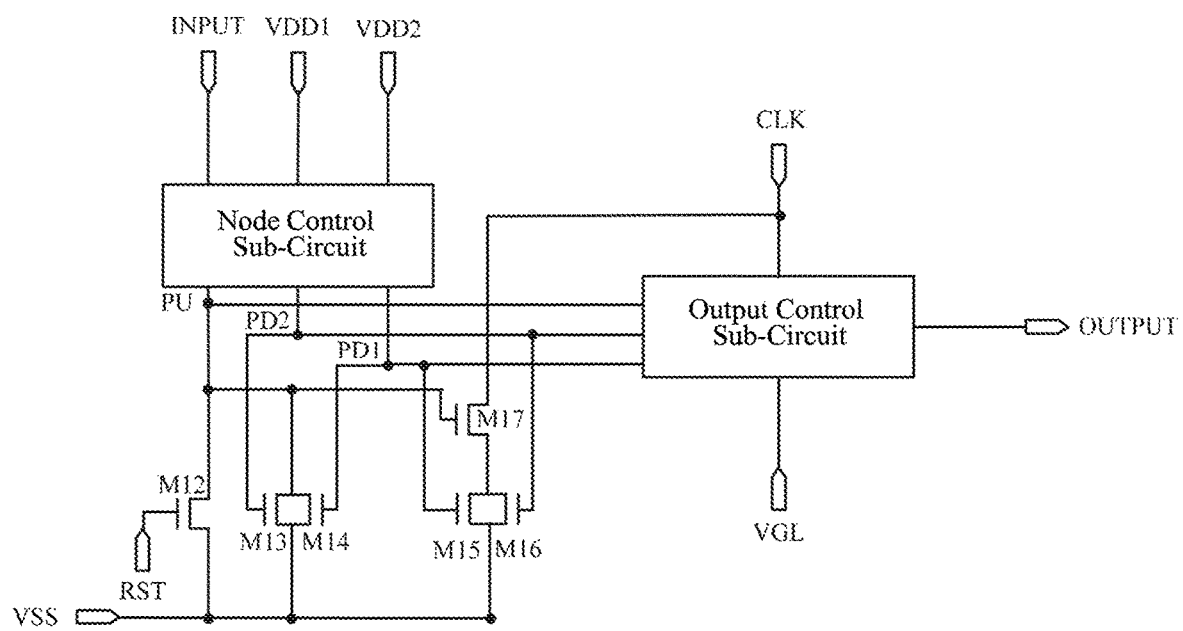
FIG. 6 is a first equivalent circuit diagram of a reset sub-circuit according to an exemplary embodiment.

FIG. 6 is a first equivalent circuit diagram of a reset sub-circuit according to an exemplary embodiment. As shown in FIG. 6, the first reset sub-circuit provided in an exemplary embodiment includes a twelfth transistor M12; the second reset sub-circuit includes a thirteenth transistor M13 and a fourteenth transistor M14; the third reset sub-circuit includes a fifteenth transistor M15, a sixteenth transistor M16 and a seventeenth transistor M17.

A control pole of the twelfth transistor M12 is connected with the reset signal end RST, a first pole of the twelfth transistor M12 is connected with the pull-up node PU, and a second pole of the twelfth transistor M12 is connected with the second power supply end VSS; a control pole of the thirteenth transistor M13 is connected with the second pull-down node PD2, a first pole of the thirteenth transistor M13 is connected with the pull-up node PU, and a second pole of the thirteenth transistor M13 is connected with the second power supply end VSS; a control pole of the fourteenth transistor M14 is connected with the first pull-down node PD1, a first pole of the fourteenth transistor M14 is connected with the pull-up node PU, and a second pole of the fourteenth transistor M14 is connected with the second power supply end VSS; a control pole of the fifteenth transistor M15 is connected with the first pull-down node PD1, a first pole of the fifteenth transistor M15 is connected with a second pole of the seventeenth transistor M17, and a second pole of the fifteenth transistor M15 is connected with the second power supply end VSS; a control pole of the sixteenth transistor M16 is connected with the second pull-down node PD2, a first pole of the sixteenth transistor M16 is connected with the second pole of the seventeenth transistor M17, and a second pole of the sixteenth transistor M16 is connected with the second power supply end VSS; a control pole of the seventeenth transistor M17 is connected with the pull-up node PU, and a first pole of the seventeenth transistor M17 is connected with the clock signal end CLK.

Figure 7:
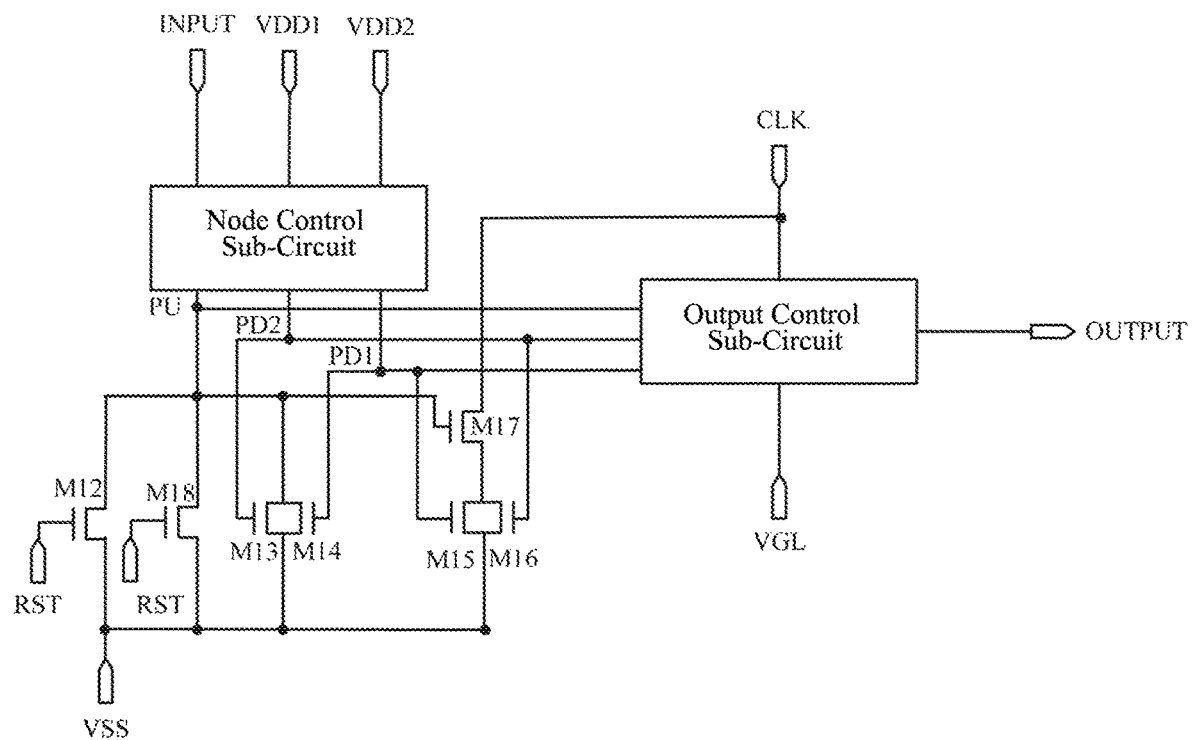
FIG. 7 is a second equivalent circuit diagram of a reset sub-circuit according to an exemplary embodiment.

FIG. 7 is a second equivalent circuit diagram of a reset sub-circuit according to an exemplary embodiment. As shown in FIG. 7, the first reset sub-circuit provided in an exemplary embodiment further includes an eighteenth transistor M18.

A control pole of the eighteenth transistor M18 is connected with the reset signal end RST, a first pole of the eighteenth transistor M18 is connected with the pull-up node PU, and a second pole of the eighteenth transistor M18 is connected with the second power supply end VSS.

In an exemplary embodiment, the eighteenth transistor M18 serves as a spare transistor for the twelfth transistor M12, so as to avoid that the shift register unit cannot be initialized when the twelfth transistor M12 cannot operate normally, which may improve operating stability and useful life of the display panel.

An exemplary structure of the reset sub-circuit is shown in FIGS. 6 and 7. Those skilled in the art easily understand that the implementation of the reset sub-circuit is not limited to this, but may also be other forms of circuit structures.

In an exemplary embodiment, adding a reset sub-circuit to the shift register unit may reduce noise in the shift register unit, and improve operating stability, use reliability and display effect of the display panel.

Figure 8:
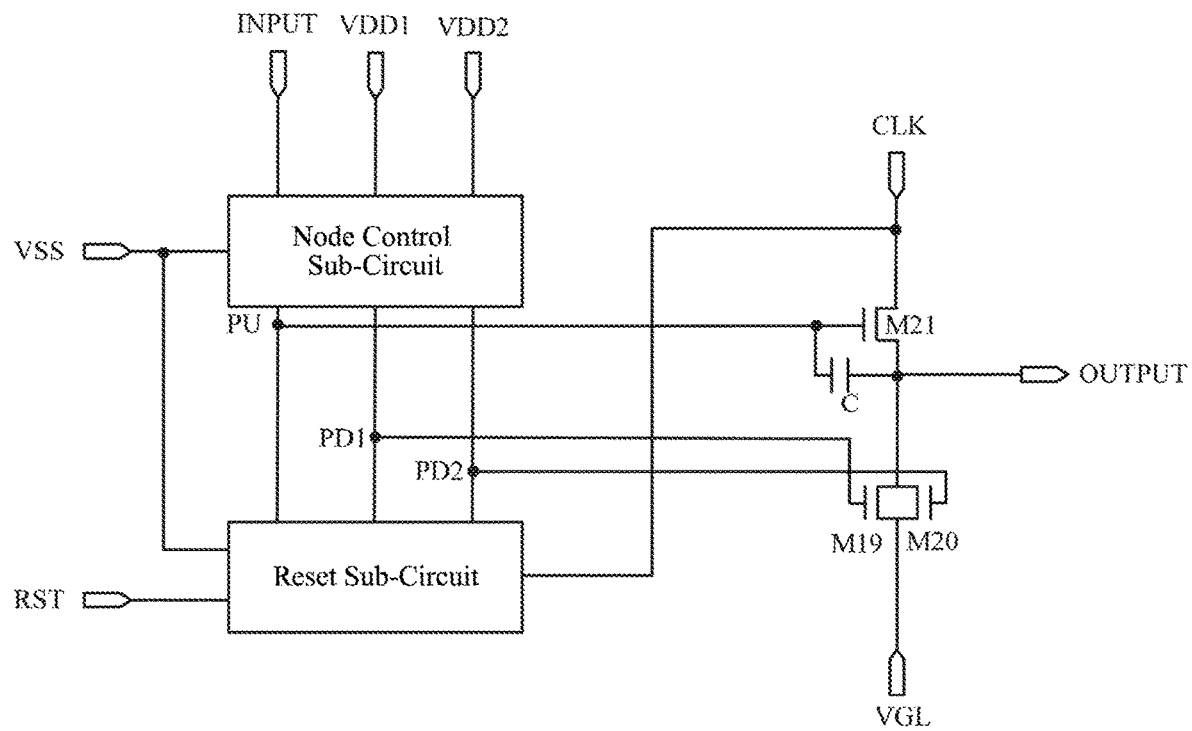
FIG. 8 is an equivalent circuit diagram of an output control sub-circuit according to an exemplary embodiment.

FIG. 8 is an equivalent circuit diagram of an output control sub-circuit according to an exemplary embodiment.

As shown in FIG. 8, the output control sub-circuit provided in an exemplary embodiment includes a capacitor C, a nineteenth transistor M19, a twentieth transistor M20 and a twenty-first transistor M21.

A first end of the capacitor C is connected with the pull-up node PU, and a second end of the capacitor C is connected with the signal output end OUTPUT; a control pole of the nineteenth transistor M19 is connected with the first pull-down node PD1, a first pole of the nineteenth transistor M19 is connected with the signal output end OUTPUT, and a second pole of the nineteenth transistor M19 is connected with the third power supply end VGL; a control pole of the twentieth transistor M20 is connected with the second pull-down node PD2, a first pole of the twentieth transistor M20 is connected with the signal output end OUTPUT, and a second pole of the twentieth transistor M20 is connected with the third power supply end VGL; a control pole of the twenty-first transistor M21 is connected with the pull-up node PU, a first pole of the twenty-first transistor M21 is connected with the clock signal end CLK, and a second pole of the twenty-first transistor M21 is connected with the signal output end OUTPUT.

The capacitor C may be a liquid crystal capacitor composed of a pixel electrode and a common electrode, or may be a liquid crystal capacitor composed of a pixel electrode and a common electrode and an equivalent capacitor composed of a storage capacitor, which is not limited in the present embodiment.

An exemplary structure of the output control sub-circuit is shown in FIG. 8. Those skilled in the art easily understand that the implementation of the output control sub-circuit is not limited to this, but may also be other forms of circuit structures.

Figure 9:
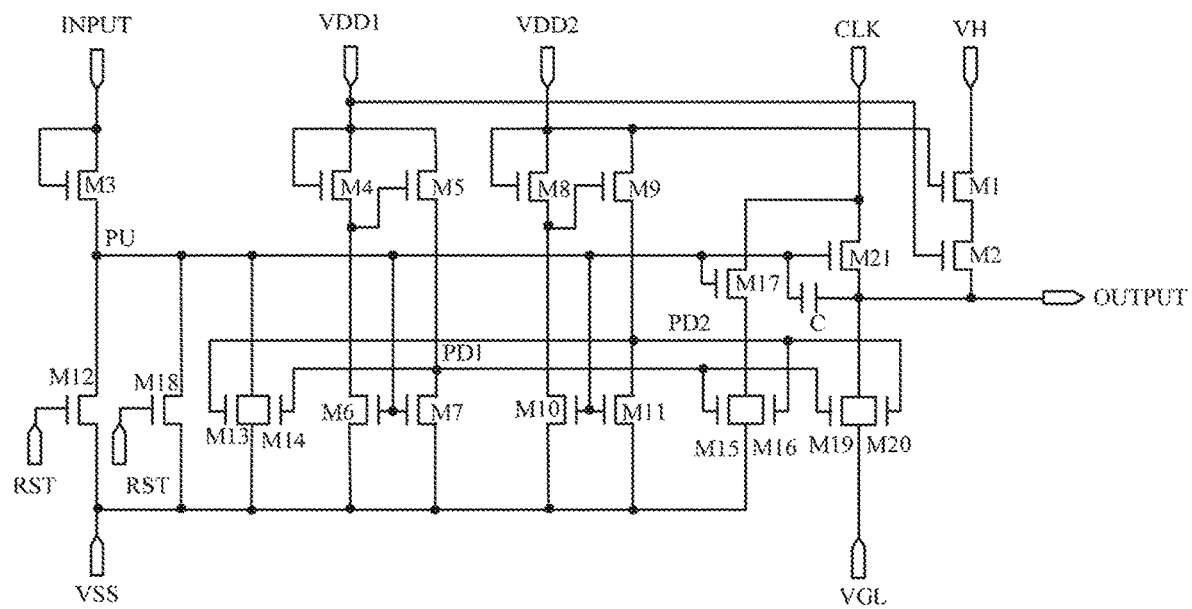
FIG. 9 is an equivalent circuit diagram of a shift register according to an exemplary embodiment.

FIG. 9 is an equivalent circuit diagram of a shift register according to an exemplary embodiment. As shown in FIG. 9, the start-up discharge circuit provided in an exemplary embodiment includes a first transistor M1 and a second transistor M2; the shift register unit includes a third transistor M3, a fourth transistor M4, a fifth transistor M5, a sixth transistor M6, a seventh transistor M7, an eighth transistor M8, a ninth transistor M9, a tenth transistor M10, an eleventh transistor M11, a twelfth transistor M12, a thirteenth transistor M13, a fourteenth transistor M14, a fifteenth transistor M15, a sixteenth transistor M16, a seventeenth transistor M17, an eighteenth transistor M18, a capacitor C, a nineteenth transistor M19, a twentieth transistor M20, and a twenty-first transistor M21.

A control pole of the first transistor M1 is connected with the first control end VDD1, a first pole of the first transistor M1 is connected with the first power supply end VH, a second pole of the first transistor M1 is connected with a first pole of the second transistor M2; a control pole of the second transistor M2 is connected with the second control end VDD2, and a second pole of the second transistor M2 is connected with the signal output end OUTPUT. A control pole and a first pole of the third transistor M3 are connected with the signal input end INPUT, and a second pole of the third transistor M3 is connected with the pull-up node PU; a control pole and a first pole of the fourth transistor M4 are connected with the first control end VDD1, and a second pole of the fourth transistor M4 is connected with a first pole of the sixth transistor M6; a control pole of the fifth transistor M5 is connected with the second pole of the fourth transistor M4, a first pole of the fifth transistor M5 is connected with the first control end VDD1, and a second pole of the fifth transistor M5 is connected with the first pull-down node PD1; a control pole of the sixth transistor M6 is connected with the pull-up node PU, and a second pole of the sixth transistor M6 is connected with the second power supply end VSS; a control pole of the seventh transistor M7 is connected with the pull-up node PU, a first pole of the seventh transistor M7 is connected with the first pull-down node PD1, and a second pole of the seventh transistor M7 is connected with the second power supply end VSS; a control pole and a first pole of the eighth transistor M8 are connected with the second control end VDD2, and a second pole of the eighth transistor M8 is connected with a first pole of the tenth transistor M10; a control pole of the ninth transistor M9 is connected with the second pole of the eighth transistor M8, a first pole of the ninth transistor M9 is connected with the second control end VDD2, and a second pole of the ninth transistor M9 is connected with the second pull-down node PD2; a control pole of the tenth transistor M10 is connected with the pull-up node PU, and a second pole of the tenth transistor M10 is connected with the second power supply end VSS; a control pole of the eleventh transistor M11 is connected with the pull-up node PU, a first pole of the eleventh transistor M11 is connected with the second pull-down node PD2, and a second pole of the eleventh transistor M11 is connected with the second power supply end VSS; a control pole of the twelfth transistor M12 is connected with the reset signal end RST, a first pole of the twelfth transistor M12 is connected with the pull-up node PU, and a second pole of the twelfth transistor M12 is connected with the second power supply end VSS; a control pole of the thirteenth transistor M13 is connected with the second pull-down node PD2, a first pole of the thirteenth transistor M13 is connected with the pull-up node PU, and a second pole of the thirteenth transistor M13 is connected with the second power supply end VSS; a control pole of the fourteenth transistor M14 is connected with the first pull-down node PD1, a first pole of the fourteenth transistor M14 is connected with the pull-up node PU, and a second pole of the fourteenth transistor M14 is connected with the second power supply end VSS; a control pole of the fifteenth transistor M15 is connected with the first pull-down node PD1, a first pole of the fifteenth transistor M15 is connected with a second pole of the seventeenth transistor M17, and a second pole of the fifteenth transistor M15 is connected with the second power supply end VSS; a control pole of the sixteenth transistor M16 is connected with the second pull-down node PD2, a first pole of the sixteenth transistor M16 is connected with the second pole of the seventeenth transistor M17, and a second pole of the sixteenth transistor M16 is connected with the second power supply end VSS; a control pole of the seventeenth transistor M17 is connected with the pull-up node PU, and a first pole of the seventeenth transistor M17 is connected with the clock signal end CLK; a control pole of the eighteenth transistor M18 is connected with the reset signal end RST, a first pole of the eighteenth transistor M18 is connected with the pull-up node PU, and a second pole of the eighteenth transistor M18 is connected with the second power supply end VSS; a first end of the capacitor C is connected with the pull-up node PU, and a second end of the capacitor C is connected with the signal output end OUTPUT; a control pole of the nineteenth transistor M19 is connected with the first pull-down node PD1, a first pole of the nineteenth transistor M19 is connected with the signal output end OUTPUT, and a second pole of the nineteenth transistor M19 is connected with the third power supply end VGL; a control pole of the twentieth transistor M20 is connected with the second pull-down node PD2, a first pole of the twentieth transistor M20 is connected with the signal output end OUTPUT, and a second pole of the twentieth transistor M20 is connected with the third power supply end VGL; a control pole of the twenty-first transistor M21 is connected with the pull-up node PU, a first pole of the twenty-first transistor M21 is connected with the clock signal end CLK, and a second pole of the twenty-first transistor M21 is connected with the signal output end OUTPUT.

In an exemplary embodiment, transistors M1 to M21 may all be N-type thin film transistors or P-type thin film transistors, and transistors of a same type may unify a process flow, reduce a process processing procedure, and be helpful to improve yield of products. In addition, consider that leakage current of a low-temperature polysilicon thin film transistor is smaller, so all transistors in an exemplary embodiment may be low-temperature polysilicon thin film transistors, and thin film transistors with bottom gate structures or thin film transistors with top gate structures may be selected for thin film transistors.

A technical solution of an exemplary embodiment is illustrated below through an operating process of a shift register.

Figure 10:
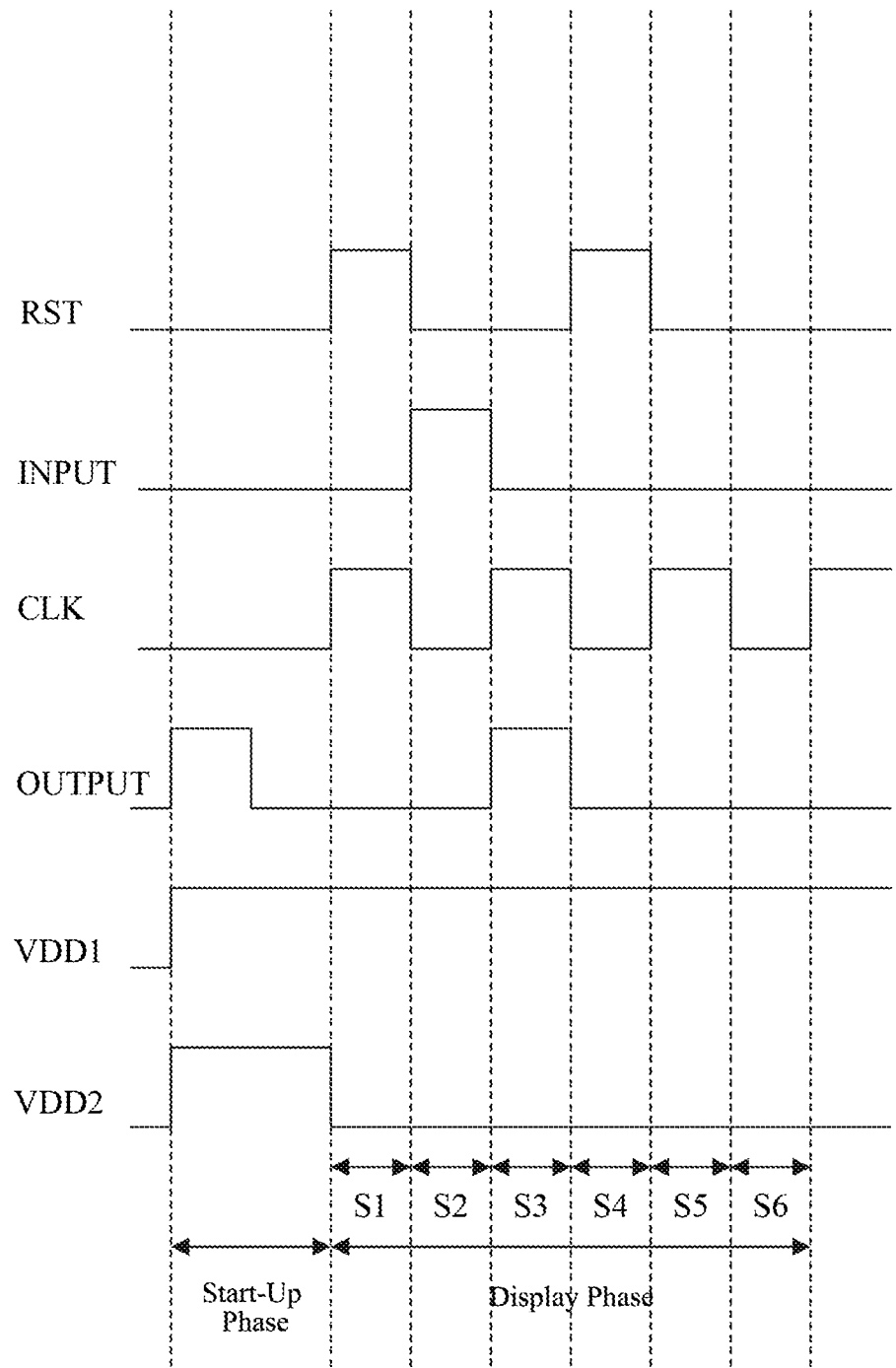
FIG. 10 is an operating timing chart of a shift register according to an exemplary embodiment.

Take transistors M1 to M21 in the shift register all being N-type thin film transistors as an example. FIG. 10 is an operating timing chart of a shift register according to an exemplary embodiment. As shown in FIGS. 9 and 10, the shift register provided in an exemplary embodiment includes 21 transistor units (M1 to M21), one capacitor (C), 5 input ends (a signal input end INPUT, a reset signal end RST, a first control end VDD1, a second control end VDD2 and a clock signal end CLK), one output end (a signal output end OUTPUT) and 3 power supply ends (a first power supply end VH, a second power supply end VSS and a third power supply end VGL).

In an exemplary embodiment, the first power supply end VH continuously provides a high electrical level in the start-up phase and the display phase, the second power supply end VSS and the third power supply end VGL have no signal in the start-up phase, and continuously provide a low electrical level in the display phase. Signals of the first control end VDD1 and the second control end VDD2 are mutually inverted signals in the display phase. FIG. 10 illustrates a signal of VDD1 of the first control end of the shift register within one frame being continuously at a high electrical level, and a signal of the second control end VDD2 being continuously at a low electrical level as an example.

The operating process of the shift register in the present embodiment includes two phases, the first phase is a start-up phase and the second phase is a display phase.

In the start-up phase, electrical levels of signals of the first control end VDD1 and the second control end VDD2 are high electrical levels, the first transistor M1 and the second transistor M2 are turned on, the signal output end OUTPUT is communicated with the first power supply end VH, and the signal output end OUTPUT outputs a high electrical level.

In the present phase, electrical levels of signals of the first control end VDD1 and the second control end VDD2 in an input end are high electrical levels, the signal input end INPUT, the reset signal end RST and the clock signal end CLK have no signals, and the signal output end OUTPUT outputs a high electrical level. Although the electrical levels of the signals of the first control end VDD1 and the second control end VDD2 are high electrical levels and the fourth transistor M4, the fifth transistor M5, the eighth transistor M8 and the ninth transistor M9 are turned on, since an electrical level of the pull-up node PU is not pulled high, the sixth transistor M6, the seventh transistor M7, the tenth transistor M10 and the eleventh transistor M11 are turned off, although electrical levels of signals of the first pull-down node PD1 and the second pull-down node PD2 are pulled high and the nineteenth transistor M19 and the twentieth transistor M20 are turned on, an electrical level of an output signal of the signal output end OUTPUT in the present phase will not be pulled low, because the third power supply end VGL has no signal in the start-up phase.

In the display phase, since signals of the first control end VDD1 and the second control end VDD2 are mutually inverted signals, the first transistor M1 and the second transistor M2 cannot be turned on at the same time, so an output signal of the signal output end OUTPUT will not be affected by a signal of the first power supply end VH. The operating process of the shift register includes following phases.

In a first phase S1, that is, an initialization phase, an electrical level of a signal of the reset signal end RST is a high electrical level, the twelfth transistor M12 and the eighteenth transistor M18 are turned on, an electrical level of the pull-up node PU is pulled low, the sixth transistor M6 and the seventh transistor M7 are turned off, an electrical level of a signal of the first control end VDD1 is a high electrical level, the fourth transistor M4 and the fifth transistor M5 are turned on, an electrical level of the first pull-down node PD1 is pulled high, the fourteenth transistor M14, and the fifteenth transistor M15 and the nineteenth transistor M19 are turned on, which may lower electrical levels of signals of the pull-up node PU and the signal output end OUTPUT to realize initialization.

In the present phase, electrical levels of signals of the first control end VDD1, the reset signal end RST and the clock signal end CLK in the input end are high electrical levels, electrical levels of signals of the signal input end INPUT and the second control end VDD2 are low electrical levels, and the signal output end OUTPUT outputs a low electrical level.

In a second phase S2, that is, an input phase, an electrical level of a signal of the signal input end INPUT is a high electrical level, the third transistor M3 is turned on, an electrical level of the pull-up node PU is pulled high, and the capacitor C is charged.

In the present phase, electrical levels of signals of the signal input end INPUT and the first control end VDD1 in the input end are high electrical levels, electrical levels of signals of the reset signal end RST, the second control end VDD2 and the clock signal end CLK are all low electrical levels, and an electrical level of an output signal of the signal output end OUTPUT is a low electrical level. Although the electrical level of the signal of the first control end VDD1 is a high electrical level, the fourth transistor M4 and the fifth transistor M5 are turned on, and the electrical level of the first pull-down node PD1 is pulled high, since the electrical level of the pull-up node PU is a high electrical level, then the sixth transistor M6 and the seventh transistor M7 are turned on, the electrical level of the first pull-down node PD1 is pulled low, the fourteenth transistor M14, the fifteenth transistor M15 and the nineteenth transistor M19 are turned off, and the electrical level of the pull-up node PU will not be pulled low.

In a third phase S3, that is, an output phase, an electrical level of a signal of the signal input end INPUT is a low electrical level, the third transistor M3 is turned off, and electrical level of the signal of the clock signal end CLK becomes a high electrical level. Since a bootstrap effect of the capacitor C, it is caused that an electrical level of the pull-up node PU continues to be pulled high, a high electrical level of the pull-up node PU turns on the twenty-first transistor M21, and the signal output end OUTPUT outputs the signal of the clock signal end CLK, that is, a gate driving signal. In addition, the increase of the electrical level of the pull-up node PU improves a conduction capability of the twenty-first transistor M21, and ensures pixel charging.

In the present phase, electrical levels of signals of the clock signal end CLK and the first control end VDD1 in the input end are high electrical levels, electrical levels of signals of the signal input end INPUT, the second control end VDD2 and the reset signal end RST are low electrical levels, and an electrical level of an output signal level of the signal output end OUTPUT is a high electrical level. Since the electrical level of the pull-up node PU is still a high electrical level, then the sixth transistor M6 and the seventh transistor M7 are still on, so that the electrical level of the first pull-down node PD1 remains low, the fourteenth transistor M14, the fifteenth transistor M15 and the nineteenth transistor M19 are turned off, and the electrical levels of the pull-up node PU and the signal output end OUTPUT will not be pulled low.

In a fourth phase S4, that is, a reset phase, an electrical level of a signal of the reset signal end RST is a high electrical level, the twelfth transistor M12 and the eighteenth transistor M18 are started, the electrical level of the pull-up node PU is pulled low, the sixth transistor M6 and the seventh transistor M7 are turned off. Since an electrical level of a signal of the first control end VDD1 is a high electrical level, the transistor M4 and the fifth transistor M5 are turned on, the electrical level of the first pull-down node PD1 is pulled high, the fourteenth transistor M14, the fifteenth transistor M15 and the nineteenth transistor M19 are turned on, the electrical level of the pull-up node PU is pulled low, and an electrical level of a signal of the signal output end OUTPUT is pulled low, in order to reduce noise.

In the present phase, electrical levels of signals of the reset signal end RST and the first control end VDD1 in the input end are high electrical levels, electrical levels of signals of the signal input end INPUT, the second control end VDD2 and the clock signal end CLK are low electrical levels, and an electrical level of an output signal of the signal output end OUTPUT is a low electrical level.

In a fifth phase S5, an electrical level of a signal of the clock signal end CLK is a high electrical level, but since the electrical level of the pull-up node PU is still a low electrical level, the twenty-first transistor M21 is turned off, and an electrical level of an output signal of the signal output end OUTPUT is a low electrical level. Meanwhile, the sixth transistor M6 and the seventh transistor M7 are turned off. Since an electrical level of a signal of the first control end VDD1 is a high electrical level, the transistor M4 and the fifth transistor M5 are still on, the electrical level of the first pull-down node PD1 is pulled high, the fourteenth transistor M14, the fifteenth transistor M15 and the nineteenth transistor M19 are turned on, the electrical level of the pull-up node PU is pulled low, and the electrical level of the signal of the signal output end OUTPUT is pulled low, in order to reduce noise.

In the present phase, electrical levels of signals of the clock signal end CLK and the first control end VDD1 in the input end are high electrical levels, electrical levels of signals of the signal input end INPUT, the second control end VDD2 and the reset signal end RST are low electrical levels, and an electrical level of an output signal of the signal output end OUTPUT is a low electrical level.

In a sixth phase S6, since the electrical level of the pull-up node PU is continuously a low electrical level, the twenty-first transistor M21 is turned off, and an electrical level of an output signal of the signal output end OUTPUT is a low electrical level, and the sixth transistor M6 and the seventh transistor M7 are turned off. Since an electrical level of a signal of the first control end VDD1 is a high electrical level, the fourth transistor M4 and the fifth transistor M5 are still on, the electrical level of the first pull-down node PD1 is pulled high, the fourteenth transistor M14, the fifteenth transistor M15 and the nineteenth transistor M19 are turned on, the electrical level of the pull-up node PU is pulled low, and the electrical level of the signal of the signal output end OUTPUT is pulled low, in order to reduce noise.

In the present phase, an electrical level of a signal of the first control end VDD1 in the input end is a high electrical level, electrical levels of signals of the signal input end INPUT, the second control end VDD2, the clock signal end CLK and the reset signal end RST are low electrical levels, and an electrical level of an output signal of the signal output end OUTPUT is a low electrical level.

After the reset phase S4, the shift register continues the fifth phase S5 and the sixth phase S6 until the electrical level of the signal of the signal input end INPUT is a high electrical level again.

In the present embodiment, in the display phase, the signal of the signal input end INPUT is a pulse signal, and is at a high electrical level only in the input phase; the signal of the signal output end OUTPUT is a pulse signal, and is at a high electrical level only in the output phase.

In the present embodiment, in the operating process of the shift register, since the electrical level of the signal of the second control end VDD2 is at a low electrical level, the electrical level of the second pull-down node PD2 is never pulled higher and cannot turn on any transistor, thus it will not affect the operating of the shift register. FIG. 10 illustrates an electrical level of a signal of the first control end VDD1 within one frame being continuously a high electrical level, and a signal of the second control end VDD2 being continuously at a low electrical level as an example. In one frame, the electrical level of the signal of the first control end VDD2 may also continue to be a low electrical level, and the electrical level of the signal of the second control end VDD2 may also continue to be a high electrical level. The operating principle of the shift register will not be described again here.

An embodiment of the present application also provides a method for driving a shift register, which is applied to a shift register provided in any one of the aforementioned embodiments. FIG. 11 is a flowchart of a method for driving a shift register according to an embodiment of the present application. As shown in FIG. 11, the method for driving a shift register according to the embodiment of the present application includes following acts: in an exemplary embodiment, the shift register includes a start-up discharge circuit, a shift register unit, a first control end, a second control end, a signal output end and a first power supply end.

Act 100: the start-up discharge circuit provides a signal of the first power supply end to the signal output end under control of the first control end and the second control end in a start-up phase.

Act 200: the shift register unit outputs a gate driving signal to the signal output end in a display phase.

In an exemplary embodiment, the shift register unit includes a node control sub-circuit, a reset sub-circuit and an output control sub-circuit, and the shift register further includes a signal input end, a second power supply end, a third power supply end, a reset signal end and a clock signal end.

Act 200 includes the following steps: in the display phase, the node control sub-circuit provides a signal of the signal input end to a pull-up node under control of the signal input end, provides a signal of the first control end or the second power supply end to a first pull-down node under control of electrical levels of the first control end and the pull-up node, or provides a signal of the second control end or the second power supply end to a second pull-down node under control of electrical levels of the second control end and the pull-up node; the reset sub-circuit provides a signal of the second power supply end to the pull-up node under control of signals of the reset signal end, the first pull-down node, or the second pull-down node, and provides a signal of the second power supply end to the clock signal end under control of the pull-up node and the first pull-down node, or under control of the pull-up node and the second pull-down node; the output control sub-circuit provides a signal of the clock signal end or the third power supply end to the signal output end under control of the electrical level of the pull-up node, or the first pull-down node, or the second pull-down node.

The shift register is a shift register provided in any of the aforementioned embodiments, and an implementation principle and an implementation effect will not be described again here.

An embodiment of the present application also provides a gate driving circuit. The gate driving circuit provided in the embodiment of the present application includes a plurality of cascaded shift registers.

The shift register is a shift register provided in any of the aforementioned embodiments, and an implementation principle and an implementation effect will not be described again here.

A signal input end of a first stage shift register is connected with an initial signal end, a signal output end OUTPUT of an N-th stage shift register is connected with a signal input end INPUT of an N+1st stage shift register, and a signal output end OUTPUT of an N+1st stage shift register is connected with a reset signal end RST of an N-th stage shift register.

In an exemplary embodiment, in the start-up phase, a signal output end of each shift register of the gate driving circuit simultaneously performs output.

An embodiment of the present application also provides a display apparatus. The display apparatus provided in the embodiment of the present application includes a gate driving circuit.

The gate driving circuit is a gate driving circuit provided in the aforementioned embodiment, and an implementation principle and an implementation effect will not be described again here.

The display apparatus may be: a mobile phone, a tablet computer, a television, a display, a notebook computer, a digital photo frame, a navigator, or any other product or component with a display function, which is not limited in any way in the present embodiment.

The drawings in the present application only refer to the structures involved in the embodiments of the present application, and other structures may refer to common designs.

Without conflict, the embodiments of the present application, i.e., the features in the embodiments may be combined with each other to obtain a new embodiment.

Although implementations disclosed in the present application are as the above, the described contents are only implementations used for facilitating understanding the present application, and are not used to limit the present application. Any person skilled in the art to which the present application pertains may make any modifications and variations in the form and details of implementation without departing from the spirit and the scope of the present application, but the patent protection scope of the present application shall still be subject to the scope defined in the appended claims.

What is claimed is:

1. A shift register, disposed on a display panel of which an operating process comprises a start-up phase and a display phase, the shift register comprising: a shift register unit, a start-up discharge circuit, a first control end, a second control end, a signal output end and a first power supply end; wherein the shift register unit is connected with the signal output end, and is configured to output a gate driving signal to the signal output end in the display phase; and the start-up discharge circuit is respectively connected with the signal output end, the first control end, the second control end and the first power supply end, and is configured to provide a signal of the first power supply end to the signal output end under control of the first control end and the second control end in the start-up phase.

2. The shift register according to claim 1, wherein the start-up discharge circuit comprises a first transistor and a second transistor;

a control pole of the first transistor is connected with the first control end, a first pole of the first transistor is connected with the first power supply end, and a second pole of the first transistor is connected with a first pole of the second transistor; and a control pole of the second transistor is connected with the second control end, and a second pole of the second transistor is connected with the signal output end.

3. The shift register according to claim 2, wherein in the start-up phase, a signal of the first control end is a first on signal and a signal of the second control end is a second on signal; and the first on signal is configured to make the first transistor in an on state, and the second on signal is configured to make the second transistor in an on state.

4. The shift register according to claim 3, wherein in the display phase, a signal of the first control end is a first on signal and a signal of the second control end is a second off signal, or a signal of the first control end is a first off signal and a signal of the second control end is a second on signal; and the first off signal is configured to make the first transistor in an off state, and the second off signal is configured to make the second transistor in an off state.

5. The shift register according to claim 1, wherein the shift register further comprises a signal input end, a reset signal end, a second power supply end, a clock signal end and a third power supply end, and the shift register unit comprises a node control sub-circuit, a reset sub-circuit and an output control sub-circuit; and the node control sub-circuit is respectively connected with the signal input end, the first control end, the second control end, a pull-up node, a first pull-down node, a second pull-down node and the second power supply end, is configured to provide a signal of the signal input end to the pull-up node under control of the signal input end, and is further configured to provide a signal of the first control end or the second power supply end to the first pull-down node under control of the first control end and the pull-up node, or provide a signal of the second control end or the second power supply end to the second pull-down node under control of the second control end and the pull-up node;

the reset sub-circuit is respectively connected with the reset signal end, the pull-up node, the second power supply end, the first pull-down node, the second pull-down node and the clock signal end, is configured to provide a signal of the second power supply end to the pull-up node under control of the reset signal end, or the first pull-down node, or the second pull-down node, and is further configured to provide a signal of the second power supply end to the clock signal end under control of the pull-up node and the first pull-down node, or under control of the pull-up node and the second pull-down node; and the output control sub-circuit is respectively connected with the pull-up node, the signal output end, the clock signal end, the first pull-down node, the second pull-down node and the third power supply end, and is configured to provide a signal of the clock signal end or the third power supply end to the signal output end under control of the pull-up node, or the first pull-down node, or the second pull-down node.

6. The shift register according to claim 5, wherein the node control sub-circuit comprises a first node control sub-circuit, a second node control sub-circuit and a third node control sub-circuit;

the first node control sub-circuit is respectively connected with the signal input end and the pull-up node, and is configured to provide a signal of the signal input end to the pull-up node under control of the signal input end;

the second node control sub-circuit is respectively connected with the first control end, the pull-up node, the first pull-down node and the second power supply end, is configured to provide a signal of the first control end to the first pull-down node under control of the first control end, and is further configured to provide a signal of the second power supply end to the first pull-down node under control of the pull-up node; and the third node control sub-circuit is respectively connected with the second control end, the pull-up node, the second pull-down node and the second power supply end, and is configured to provide a signal of the second control end to the second pull-down node under control of the second control end, and is further configured to provide a signal of the second power supply end to the second pull-down node under control of the pull-up node.

7. The shift register according to claim 6, wherein the first node control sub-circuit comprises a third transistor, the second node control sub-circuit comprises a fourth transistor, a fifth transistor, a sixth transistor and a seventh transistor, the third node control sub-circuit comprises an eighth transistor, a ninth transistor, a tenth transistor and an eleventh transistor;

a control pole and a first pole of the third transistor are connected with the signal input end, and a second pole of the third transistor is connected with the pull-up node;

a control pole and a first pole of the fourth transistor are connected with the first control end, a second pole of the fourth transistor is connected with a first pole of the sixth transistor;

a control pole of the fifth transistor is connected with the second pole of the fourth transistor, a first pole of the fifth transistor is connected with the first control end, and a second pole of the fifth transistor is connected with the first pull-down node;

a control pole of the sixth transistor is connected with the pull-up node, and a second pole of the sixth transistor is connected with the second power supply end;

a control pole of the seventh transistor is connected with the pull-up node, a first pole of the seventh transistor is connected with the first pull-down node, and a second pole of the seventh transistor is connected with the second power supply end;

a control pole and a first pole of the eighth transistor are connected with the second control end, and a second pole of the eighth transistor is connected with a first pole of the tenth transistor;

a control pole of the ninth transistor is connected with the second pole of the eighth transistor, a first pole of the ninth transistor is connected with the second control end, and a second pole of the ninth transistor is connected with the second pull-down node;

a control pole of the tenth transistor is connected with the pull-up node, and a second pole of the tenth transistor is connected with the second power supply end; and a control pole of the eleventh transistor is connected with the pull-up node, a first pole of the eleventh transistor is connected with the second pull-down node, and a second pole of the eleventh transistor is connected with the second power supply end.

8. The shift register according to claim 5, wherein the reset sub-circuit comprises a first reset sub-circuit, a second reset sub-circuit and a third reset sub-circuit;

the first reset sub-circuit is respectively connected with the reset signal end, the pull-up node and the second power supply end, and is configured to provide a signal of the second power supply end to the pull-up node under control of the reset signal end;

the second reset sub-circuit is respectively connected with the first pull-down node, the second pull-down node, the pull-up node and the second power supply end, and is configured to provide a signal of the second power supply end to the pull-up node under control of the first pull-down node or the second pull-down node; and the third reset sub-circuit is respectively connected with the first pull-down node, the second pull-down node, the pull-up node, the clock signal end and the second power supply end, and is configured to provide a signal of the second power supply end to the clock signal end under control of the pull-up node and the first pull-down node, or under control of the pull-up node and the second pull-down node.

9. The shift register according to claim 8, wherein the first reset sub-circuit comprises a twelfth transistor, the second reset sub-circuit comprises a thirteenth transistor and a fourteenth transistor, and the third reset sub-circuit comprises a fifteenth transistor, a sixteenth transistor and a seventeenth transistor;

a control pole of the twelfth transistor is connected with the reset signal end, a first pole of the twelfth transistor is connected with the pull-up node, and a second pole of the twelfth transistor is connected with the second power supply end;

a control pole of the thirteenth transistor is connected with the second pull-down node, a first pole of the thirteenth transistor is connected with the pull-up node, and a second pole of the thirteenth transistor is connected with the second power supply end;

a control pole of the fourteenth transistor is connected with the first pull-down node, a first pole of the fourteenth transistor is connected with the pull-up node, and a second pole of the fourteenth transistor is connected with the second power supply end;

a control pole of the fifteenth transistor is connected with the first pull-down node, a first pole of the fifteenth transistor is connected with a second pole of the seventeenth transistor, and a second pole of the fifteenth transistor is connected with the second power supply end;

a control pole of the sixteenth transistor is connected with the second pull-down node, a first pole of the sixteenth transistor is connected with the second pole of the seventeenth transistor, and a second pole of the sixteenth transistor is connected with the second power supply end; and a control pole of the seventeenth transistor is connected with the pull-up node, and a first pole of the seventeenth transistor is connected with the clock signal end.

10. The shift register according to claim 9, wherein the first reset sub-circuit further comprises an eighteenth transistor; and a control pole of the eighteenth transistor is connected with the reset signal end, a first pole of the eighteenth transistor is connected with the pull-up node, and a second pole of the eighteenth transistor is connected with the second power supply end.

11. The shift register according to claim 5, wherein the output control sub-circuit comprises a capacitor, a nineteenth transistor, a twentieth transistor and a twenty-first transistor;

a first end of the capacitor is connected with the pull-up node, and a second end of the capacitor is connected with the signal output end;

a control pole of the nineteenth transistor is connected with the first pull-down node, a first pole of the nineteenth transistor is connected with the signal output end, and a second pole of the nineteenth transistor is connected with the third power supply end;

a control pole of the twentieth transistor is connected with the second pull-down node, a first pole of the twentieth transistor is connected with the signal output end, a second pole of the twentieth transistor is connected with the third power supply end; and a control pole of the twenty-first transistor is connected with the pull-up node, a first pole of the twenty-first transistor is connected with the clock signal end, and a second pole of the twenty-first transistor is connected with the signal output end.

12. The shift register according to claim 1, wherein the start-up discharge circuit comprises a first transistor and a second transistor;

the shift register unit comprises a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor, a fifteenth transistor, a sixteenth transistor, a seventeenth transistor, an eighteenth transistor, a capacitor, a nineteenth transistor, a twentieth transistor and a twenty-first transistor;

a control pole of the first transistor is connected with the first control end, a first pole of the first transistor is connected with the first power supply end, and a second pole of the first transistor is connected with a first pole of the second transistor;

a control pole of the second transistor is connected with the second control end, and a second pole of the second transistor is connected with the signal output end;

a control pole and a first pole of the third transistor are connected with the signal input end, and a second pole of the third transistor is connected with the pull-up node;

a control pole and a first pole of the fourth transistor are connected with the first control end, a second pole of the fourth transistor is connected with a first pole of the sixth transistor;

a control pole of the fifth transistor is connected with the second pole of the fourth transistor, a first pole of the fifth transistor is connected with the first control end, and a second pole of the fifth transistor is connected with the first pull-down node;

a control pole of the sixth transistor is connected with the pull-up node, and a second pole of the sixth transistor is connected with the second power supply end;

a control pole of the seventh transistor is connected with the pull-up node, a first pole of the seventh transistor is connected with the first pull-down node, and a second pole of the seventh transistor is connected with the second power supply end;

a control pole and a first pole of the eighth transistor are connected with the second control end, and a second pole of the eighth transistor is connected with a first pole of the tenth transistor;

a control pole of the ninth transistor is connected with the second pole of the eighth transistor, a first pole of the ninth transistor is connected with the second control end, and a second pole of the ninth transistor is connected with the second pull-down node;

a control pole of the tenth transistor is connected with the pull-up node, and a second pole of the tenth transistor is connected with the second power supply end;

a control pole of the eleventh transistor is connected with the pull-up node, a first pole of the eleventh transistor is connected with the second pull-down node, and a second pole of the eleventh transistor is connected with the second power supply end;

a control pole of the twelfth transistor is connected with the reset signal end, a first pole of the twelfth transistor is connected with the pull-up node, and a second pole of the twelfth transistor is connected with the second power supply end;

a control pole of the thirteenth transistor is connected with the second pull-down node, a first pole of the thirteenth transistor is connected with the pull-up node, and a second pole of the thirteenth transistor is connected with the second power supply end;

a control pole of the fourteenth transistor is connected with the first pull-down node, a first pole of the fourteenth transistor is connected with the pull-up node, and a second pole of the fourteenth transistor is connected with the second power supply end;

a control pole of the fifteenth transistor is connected with the first pull-down node, a first pole of the fifteenth transistor is connected with a second pole of the seventeenth transistor, and a second pole of the fifteenth transistor is connected with the second power supply end;

a control pole of the sixteenth transistor is connected with the second pull-down node, a first pole of the sixteenth transistor is connected with the second pole of the seventeenth transistor, and a second pole of the sixteenth transistor is connected with the second power supply end;

a control pole of the seventeenth transistor is connected with the pull-up node, and a first pole of the seventeenth transistor is connected with the clock signal end;

a control pole of the eighteenth transistor is connected with the reset signal end, a first pole of the eighteenth transistor is connected with the pull-up node, and a second pole of the eighteenth transistor is connected with the second power supply end;

a first end of the capacitor is connected with the pull-up node, and a second end of the capacitor is connected with the signal output end;

a control pole of the nineteenth transistor is connected with the first pull-down node, a first pole of the nineteenth transistor is connected with the signal output end, and a second pole of the nineteenth transistor is connected with the third power supply end;

a control pole of the twentieth transistor is connected with the second pull-down node, a first pole of the twentieth transistor is connected with the signal output end, a second pole of the twentieth transistor is connected with the third power supply end; and a control pole of the twenty-first transistor is connected with the pull-up node, a first pole of the twenty-first transistor is connected with the clock signal end, and a second pole of the twenty-first transistor is connected with the signal output end.

13. A gate driving circuit, comprising a plurality of cascaded shift registers according to claim 1.

14. A display apparatus, comprising a gate driving circuit according to claim 13.

15. A method for driving a shift register, applied to a shift register according to claim 1, comprising:

providing, by a start-up discharge circuit, a signal of a first power supply end to a signal output end under control of a first control end and a second control end in a start-up phase; and outputting, by a shift register unit, a gate driving signal to the signal output end in a display phase.

* * * * *